United States Patent
Lu et al.

(10) Patent No.: US 10,325,942 B2
(45) Date of Patent: Jun. 18, 2019

(54) TFT SUBSTRATE MANUFACTURING METHOD

(71) Applicant: Shenzhen China Star Optoelectronics Technology Co., Ltd., Shenzhen (CN)

(72) Inventors: Macai Lu, Shenzhen (CN); Shuli Zhao, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 233 days.

(21) Appl. No.: 15/119,721

(22) PCT Filed: Jul. 27, 2016

(86) PCT No.: PCT/CN2016/091810
§ 371 (c)(1),
(2) Date: Aug. 18, 2016

(87) PCT Pub. No.: WO2017/219438
PCT Pub. Date: Dec. 28, 2017

(65) Prior Publication Data
US 2018/0182787 A1    Jun. 28, 2018

(30) Foreign Application Priority Data
Jun. 22, 2016 (CN) .......................... 2016 1 0455613

(51) Int. Cl.
*H01L 27/12* (2006.01)
*H01L 21/31* (2006.01)
(Continued)

(52) U.S. Cl.
CPC .... *H01L 27/1288* (2013.01); *H01L 21/31138* (2013.01); *H01L 21/77* (2013.01);
(Continued)

(58) Field of Classification Search
CPC .......... H01L 27/1288; H01L 21/31138; H01L 27/1225; H01L 29/66
(Continued)

(56) References Cited

U.S. PATENT DOCUMENTS 5,876,903 A * 3/1999 Ng ............................. G03F 7/40
257/E21.027
6,664,149 B2 * 12/2003 Shih .................... H01L 27/1214
438/151
(Continued)

FOREIGN PATENT DOCUMENTS

CN    101630640 A    1/2010
CN    102768990 A    11/2012

*Primary Examiner* — Sheikh Maruf
(74) *Attorney, Agent, or Firm* — Leong C. Lei

(57) ABSTRACT

The present invention relates to a TFT substrate manufacturing method. The TFT substrate manufacturing method includes: Step 10: applying a first mask-based operation to form a TFT gate electrode pattern on a base plate; Step 20: applying a second mask-based operation to form an active layer pattern and a source/drain metal electrode pattern on the base plate; Step 30: depositing a passivation layer on the base plate, applying a third mask-based operation to define a pixel electrode pattern, conducting etching and photoresist haze operations, and then depositing a pixel electrode; and Step 40: conducting etching or direct photoresist stripping to form the pixel electrode pattern. The TFT substrate manufacturing method according to the present invention provides an effective method of stripping ITO deposited on PR, which is applicable to a three-mask based TFT manufacturing process and could greatly improve manufacturing efficiency and reduce difficulty to thereby effectively enhance capability of the three-mask based manufacturing process.

15 Claims, 4 Drawing Sheets

(51) Int. Cl.
  *H01L 29/66* (2006.01)
  *H01L 21/77* (2017.01)
  *H01L 21/311* (2006.01)

(52) U.S. Cl.
  CPC .......... *H01L 27/12* (2013.01); *H01L 27/1225* (2013.01); *H01L 29/66765* (2013.01); *H01L 29/66969* (2013.01)

(58) Field of Classification Search
  USPC .................................................. 438/100–107
  See application file for complete search history.

(56) References Cited

U.S. PATENT DOCUMENTS

| | | | | |
|---|---|---|---|---|
| 6,800,535 | B1* | 10/2004 | Tsai | H01L 27/1087 438/243 |
| 2002/0123241 | A1* | 9/2002 | Kido | G02F 1/13458 438/784 |
| 2003/0219683 | A1* | 11/2003 | Nagarajan | G03F 7/40 430/296 |
| 2004/0091820 | A1* | 5/2004 | Nagai | G03F 7/2024 430/317 |
| 2004/0191968 | A1* | 9/2004 | Yang | H01L 27/1214 438/151 |
| 2004/0207784 | A1* | 10/2004 | Lim | G02F 1/133555 349/114 |
| 2004/0221876 | A1* | 11/2004 | Waleh | B08B 7/00 134/30 |
| 2005/0100832 | A1* | 5/2005 | Adachi | G03B 27/00 430/395 |
| 2005/0140874 | A1* | 6/2005 | Lim | G02F 1/133555 349/114 |
| 2005/0221546 | A1* | 10/2005 | Lee | H01L 21/31144 438/158 |
| 2007/0042537 | A1* | 2/2007 | Lee | H01L 27/124 438/158 |
| 2008/0003726 | A1* | 1/2008 | Park | H01L 27/1288 438/149 |
| 2008/0061295 | A1* | 3/2008 | Wang | H01L 27/124 257/59 |
| 2008/0105873 | A1* | 5/2008 | Wang | H01L 27/1248 257/59 |
| 2008/0111136 | A1* | 5/2008 | Qiu | H01L 29/78696 257/72 |
| 2008/0176346 | A1* | 7/2008 | Shih | G02F 1/136227 438/29 |
| 2008/0213472 | A1* | 9/2008 | Song | G02F 1/134363 427/162 |
| 2009/0218571 | A1* | 9/2009 | Chen | H01L 27/1288 257/59 |
| 2010/0086877 | A1* | 4/2010 | Soma | B29C 33/42 430/323 |
| 2010/0159652 | A1* | 6/2010 | Kim | H01L 27/1214 438/158 |
| 2010/0252832 | A1* | 10/2010 | Asano | H01L 27/1214 257/57 |
| 2012/0133873 | A1* | 5/2012 | Park | H01L 27/1288 349/138 |
| 2013/0069272 | A1* | 3/2013 | Ootera | G11B 5/855 264/241 |
| 2013/0119385 | A1* | 5/2013 | Kao | H01L 27/1288 257/57 |
| 2014/0256096 | A1* | 9/2014 | Koezuka | H01L 27/1288 438/163 |
| 2014/0264323 | A1* | 9/2014 | Sasagawa | H01L 29/7869 257/43 |
| 2014/0353660 | A1* | 12/2014 | Jung | H01L 27/1288 257/43 |
| 2015/0021597 | A1* | 1/2015 | Lu | H01L 29/66742 257/43 |
| 2015/0155310 | A1* | 6/2015 | Lee | H01L 27/1225 257/43 |
| 2015/0162489 | A1* | 6/2015 | Kao | H01L 21/707 257/43 |
| 2015/0236053 | A1* | 8/2015 | Jiang | H01L 21/0273 257/72 |
| 2016/0056184 | A1* | 2/2016 | Wei | H01L 27/1255 257/43 |
| 2016/0148958 | A1* | 5/2016 | Kim | H01L 29/7869 438/104 |
| 2016/0172389 | A1* | 6/2016 | Kao | H01L 29/7869 257/66 |
| 2017/0012065 | A1* | 1/2017 | Xiao | H01L 27/1288 |
| 2017/0162706 | A1* | 6/2017 | Lu | H01L 21/02532 |
| 2017/0315394 | A1* | 11/2017 | Wu | H01L 21/32133 |

* cited by examiner

TFT SUBSTRATE MANUFACTURING METHOD

BACKGROUND OF THE INVENTION

1. Field of the Invention

The present invention relates to the field of manufacturing of flat panel display devices, and in particular to a thin-film transistor (TFT) substrate manufacturing method.

2. The Related Arts

Recently, with the fast progress of the display technology, flat panel display devices have taken the place of bulky and heavy cathode ray tube (CRT) display devices and have got deeply involved in everyday living of human beings. Currently, the most commonly used flat panel display devices include liquid crystal displays (LCDs) and organic light-emitting diode (OLED) displays. The flat panel display devices have advantages including small size, low power consumption, and being free of radiation and take a leading position in the contemporary flat panel display market.

In an array substrate of a flat panel display device, each pixel is provided with a switching element, which is a thin-film transistor (TFT), for controlling the pixel. The TFT comprises, at least, a gate electrode, a source electrode, a drain electrode, a gate insulation layer, and an active layer. A drive circuit is provided for individually controls each pixel without causing influence, such as cross-talking, on other pixels.

TFT backplanes that are commonly used are generally made of materials including amorphous silicon (A-Si), low temperature poly-silicon, metal oxides, and organic semiconductors. Considering the techniques of manufacturing, amorphous silicon semiconductors based processes are the simplest ones and the techniques associated therewith are relatively mature so that they are the main-stream semiconductor materials. However, a manufacturing process involving amorphous silicon semiconductors is generally a process requiring operations involving five masks or four masks. Manufacturing processes that involve metal semiconductors generally use an etch stop structure, which requires a process involving six masks. For the known techniques, whether an amorphous silicon semiconductor based manufacturing process or a metal oxide semiconductor based manufacturing process is used, the process of manufacturing is complicated and the cost is high.

With the development of the TFT technology, masks used in a TFT manufacturing process have reduced from five or six masks to four masks that are used in a current mainstream process so that the cost has been significantly reduced. For each reduction of one mask, the costs of machinery, material, and time can be reduced to thereby greatly improve the market competition power of products. Three-mask based A-Si TFT, due to saving one more mask, has more significantly reduced the cost so that techniques associated therewith are more favored.

Heretofore, the known three-mask based TFT technology is, mostly, forming passivation (PV) and pixel ITO (Indium Tin Oxide) with one mask, but commonly suffers a peeling issue of ITO on PR (photoresist). Generally, the peeling time of pixel ITO deposited on PR is relatively long and thus affects the tact time and in addition, residues and burring of PR peeling would severely affect the manufacturing process of the performance of products.

SUMMARY OF THE INVENTION

An object of the present invention is to provide a three-mask based thin-film transistor (TFT) substrate manufacturing method, which improves the manufacturing efficiency and reduces the difficulty.

To achieve the above object, the present invention provides a TFT substrate manufacturing method, which comprises:

Step 10: applying a first mask-based operation to form a TFT gate electrode pattern on a base plate;

Step 20: applying a second mask-based operation to form an active layer pattern and a source/drain metal electrode pattern on the base plate;

Step 30: depositing a passivation layer on the base plate, applying a third mask-based operation to define a pixel electrode pattern, conducting etching and photoresist haze operations, and then depositing a pixel electrode; and Step 40: conducting etching or direct photoresist stripping to form the pixel electrode pattern.

In the above TFT substrate manufacturing method, the second mask-based operation involves a half tone mask or a gray tone mask.

In the above TFT substrate manufacturing method, the third mask-based operation involves a half tone mask or a regular mask.

In the above TFT substrate manufacturing method, Step 30 comprises: depositing the passivation layer on the base plate, and coating photoresist, conducting exposure and development with the third mask-based operation to define the pixel electrode pattern, conducting etching to expose a gate pattern and a source/drain metal electrode pattern, and conducting etching to form a haze surface on the photoresist, and then depositing the pixel electrode.

In the above TFT substrate manufacturing method, tapers on the photoresist have a height of 10 Å-10000 Å, the tapers having a maximum angle greater than 80 degrees, a taper-to-taper spacing distance being 10 Å-20000 Å.

In the above TFT substrate manufacturing method, the etching is dry etching.

In the above TFT substrate manufacturing method, an etching gas used in the dry etching is one or a mixture of gases of $SF_6$, $CF_4$, $C_4F_8$, Ar, He, and $O_2$ and an etching pressure is 5 mT-10000 mT.

In the above TFT substrate manufacturing method, the active layer comprises amorphous silicon (A-Si) or indium gallium zinc oxide (IGZO).

In the above TFT substrate manufacturing method, the passivation layer comprises $SiN_x$ or SiO.

In the above TFT substrate manufacturing method, the pixel electrode comprises indium tin oxide (ITO).

The present invention also provides a TFT substrate manufacturing method, which comprises:

Step 10: applying a first mask-based operation to form a TFT gate electrode pattern on a base plate;

Step 20: applying a second mask-based operation to form an active layer pattern and a source/drain metal electrode pattern on the base plate;

Step 30: depositing a passivation layer on the base plate, applying a third mask-based operation to define a pixel electrode pattern, conducting etching and photoresist haze operations, and then depositing a pixel electrode; and Step 40: conducting etching or direct photoresist stripping to form the pixel electrode pattern;

wherein the active layer comprises amorphous silicon (A-Si) or indium gallium zinc oxide (IGZO);

wherein the passivation layer comprises $SiN_x$ or SiO; and wherein the pixel electrode comprises indium tin oxide (ITO).

In summary, the TFT manufacturing method according to the present invention provides an effective method of stripping ITO deposited on PR, which is applicable to a three-mask based TFT manufacturing process and could greatly improve manufacturing efficiency and reduce difficulty to thereby effectively enhance capability of the three-mask based manufacturing process.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawing.

DETAILED DESCRIPTION OF THE PREFERRED EMBODIMENTS

Figure 1:
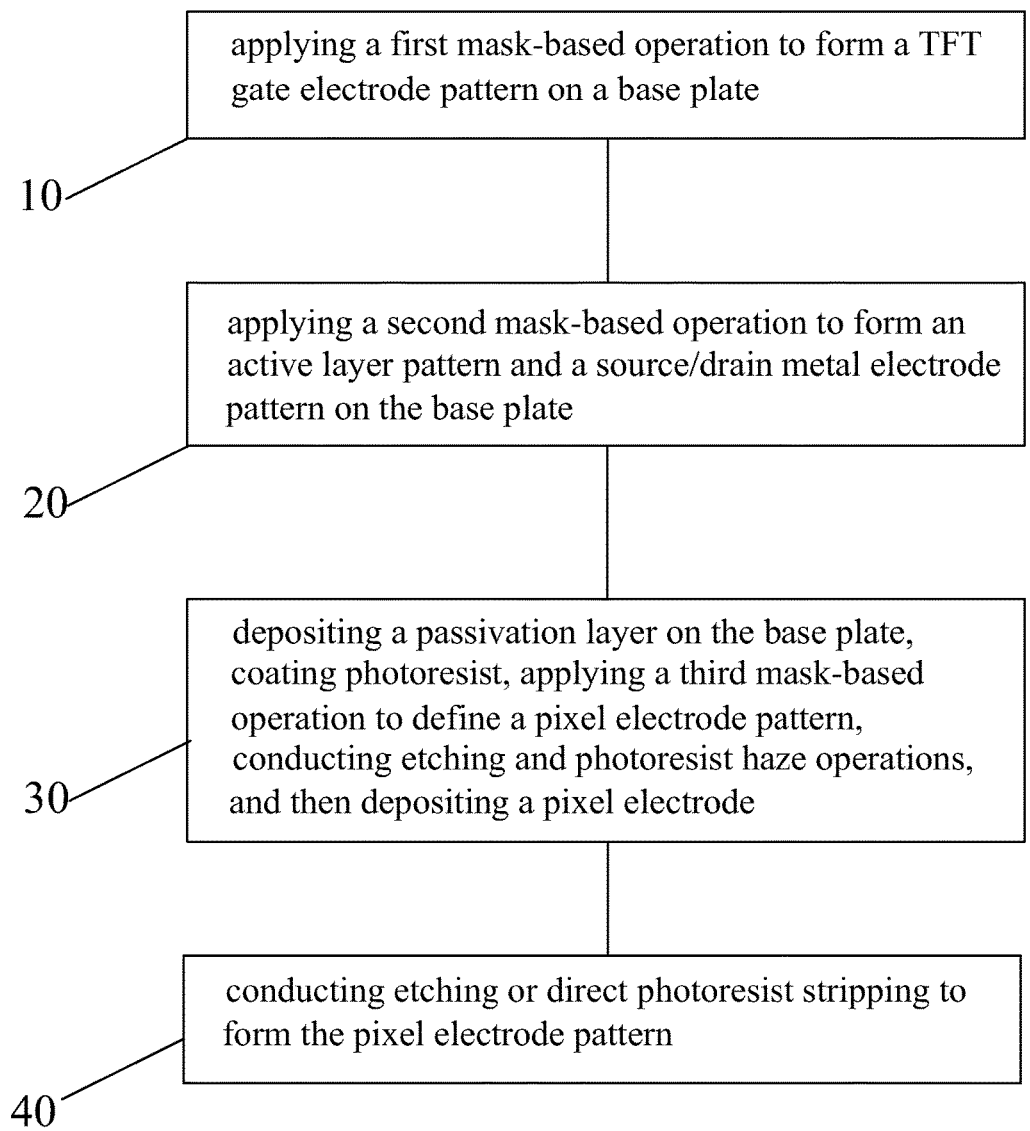
FIG. 1 is a flow chart illustrating a thin-film transistor (TFT) substrate manufacturing method according to the present invention.

Referring to FIG. 1, a flow chart is provided to illustrate a thin-film transistor (TFT) substrate manufacturing method according to the present invention. The method generally comprises:

Step 10: applying a first mask-based operation to form a TFT gate electrode pattern on a base plate;

Step 20: applying a second mask-based operation to form an active layer pattern and a source/drain metal electrode pattern on the base plate;

Step 30: depositing a passivation layer on the base plate, applying a third mask-based operation to define a pixel electrode pattern, conducting etching and photoresist haze operations, and then depositing a pixel electrode; and Step 40: conducting etching or direct photoresist stripping to form the pixel electrode pattern.

Figure 2:
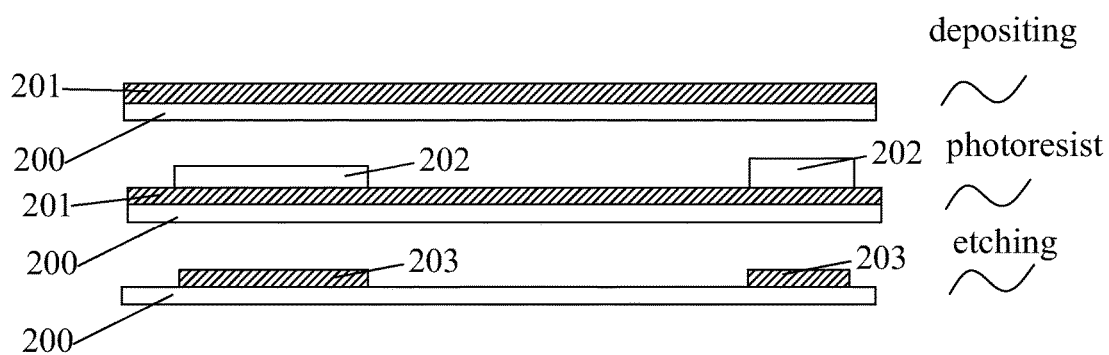
FIG. 2 is a schematic view illustrating a first mask-based operation of a preferred embodiment of the TFT substrate manufacturing method according to the present invention.

Referring to FIG. 2, which is a schematic view illustrating the first mask-based operation of a preferred embodiment of the TFT substrate manufacturing method according to the present invention, the following is provided, in combination with FIG. 2, to describe, from top to bottom, Step 10 of the present invention. A first metal layer 201 is deposited on a glass plate 200 and photoresist 202 is coated, exposed, and developed, followed by etching to form a TFT metal gate pattern 203.

Figure 3:
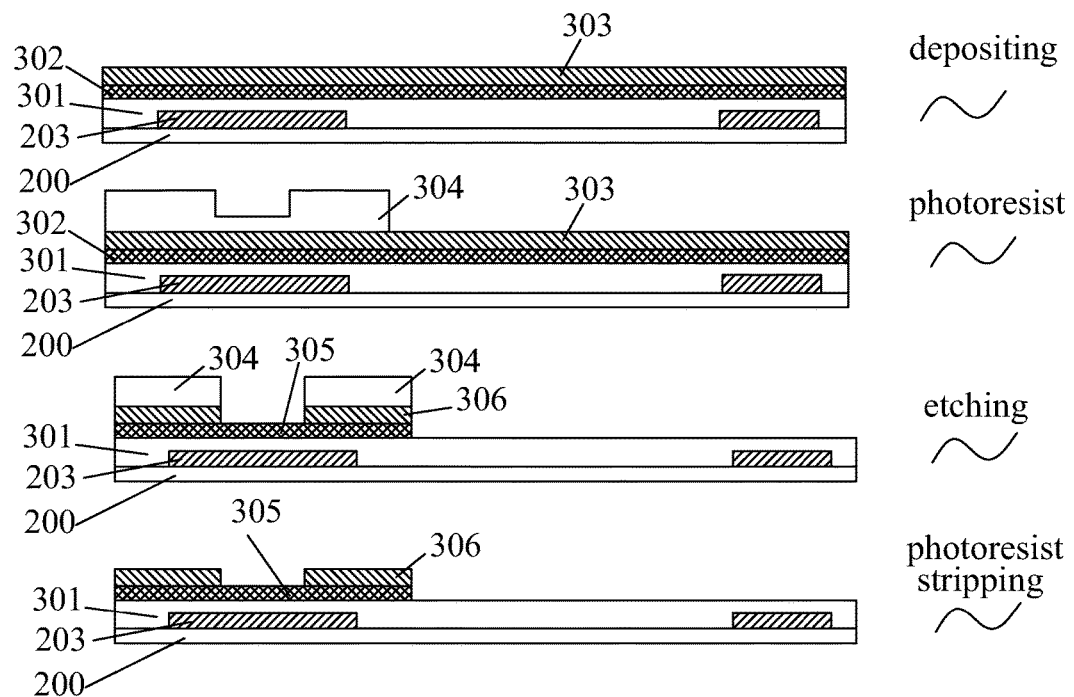
FIG. 3 is a schematic view illustrating a second mask-based operation of the preferred embodiment of the TFT substrate manufacturing method according to the present invention.

Referring to FIG. 3, which is a schematic view illustrating a second mask-based operation of the preferred embodiment of the TFT substrate manufacturing method according to the present invention, the following is provided, in combination with FIG. 3, to describe, from top to bottom, Step 20 of the present invention. The base plate 200 is subjected to deposition of a gate insulation layer 301 and a semiconductor layer 302, such as A-Si and IGZO, and deposition of a second metal layer 303 thereon and photoresist 304 is coated and a HT/GT (half tone/gray tone) mask is used to subject the photoresist 304 to exposure, development, and etching so as to form a semiconductor active layer pattern 305 and a source/drain metal electrode pattern 306.

Figure 4:
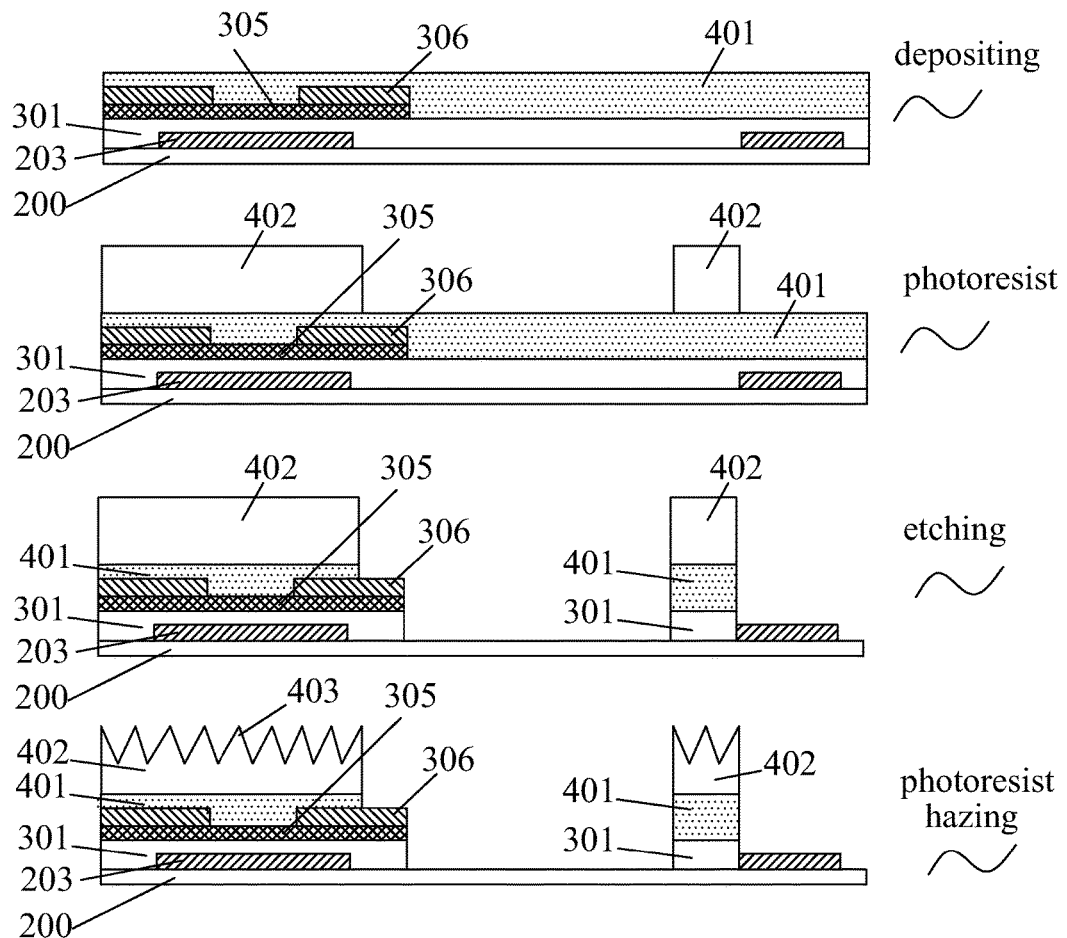
FIG. 4 is a schematic view illustrating a third mask-based operation of the preferred embodiment of the TFT substrate manufacturing method according to the present invention.

Referring to FIG. 4, is a schematic view illustrating a third mask-based operation of the preferred embodiment of the TFT substrate manufacturing method according to the present invention, the following is provided, in combination with FIG. 4, to describe, from top to bottom, Step 30 of the present invention. Afterwards, the base plate 200 is subjected to deposition of a passivation (PV) layer 401, of which the material is SiNx and SiO. Next, the base plate 200 is subjected to coating, exposure, and development of photoresist 402 to form a pixel electrode pattern. Next, etching is applied, according to the pixel electrode pattern, to the PV layer 401 and the gate insulation layer 301 to remove portions of the PV layer 401 and the gate insulation layer 301 that are not covered by the photoresist 402 in order to expose a portion of the source/drain metal electrode pattern 306 that is in contact engagement with the pixel electrode pattern and the metal gate pattern 203. The etching operation can be dry etching, namely plasma etching, where an etching gas is one or a mixture of gases of $SF_6$, $CF_4$, $C_4F_8$, Ar, He, and $O_2$ and etching pressure is 5 mT-10000 mT. After the etching, the photoresist 402 is subjected to photoresist (PR) haze/photoresist surface layer hardening treatment, where etching or other processes are applied to haze photoresist that defines the passivation layer photoresist and a pixel area so as to generated a haze surface to increase surface roughness, whereby a surface of the photoresist 402 shows a haze surface. The term "haze surface" refers to surface roughness of the photoresist being great such that tapers 403 on plane of the photoresist 402 are 10 Å-10000 Å and a maximum angle of the tapers 403 is greater than 80 degrees, spacing distance between one taper 403 and an adjacent taper 403 being 10 Å-20000 Å. The third mask-based operation can be a half tone mask or a regular mask.

Figure 5:
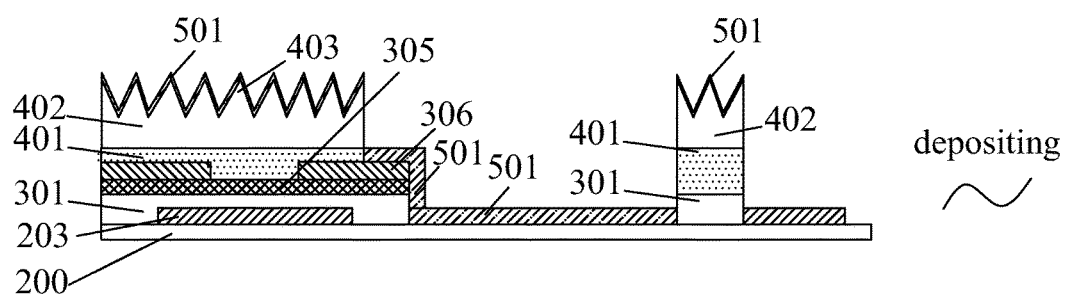
FIG. 5 is a schematic view illustrating deposition of a pixel electrode in the third mask-based operation of the preferred embodiment of the TFT substrate manufacturing method according to the present invention.

Next, referring to FIG. 5, a schematic view is given to illustrate deposition of a pixel electrode in the third mask-based operation of the preferred embodiment of the TFT substrate manufacturing method according to the present invention. After hazing of the photoresist 402, the base plate 200 is subjected to deposition of a pixel electrode 501, such as ITO or other conductive materials. After the deposition, annealing treatment is conducted (for annealing of ITO or other conductive materials).

Figure 6:
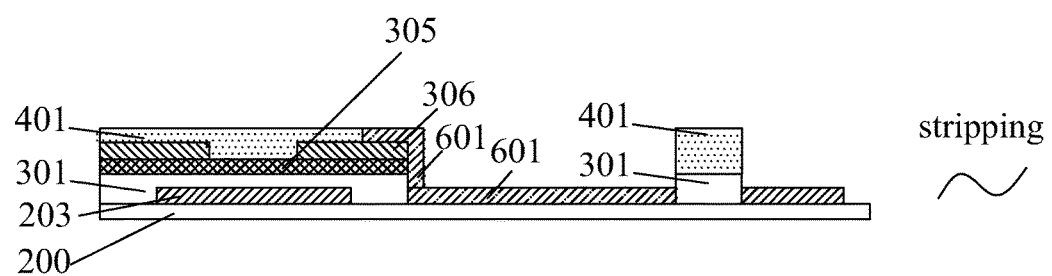
FIG. 6 is a schematic view illustrating formation of a pixel electrode in a preferred embodiment of the TFT substrate manufacturing method according to the present invention.

Next, referring to FIG. 6, which is a schematic view illustrating formation of a pixel electrode in a preferred embodiment of the TFT substrate manufacturing method according to the present invention, description of Step 40 of the present invention is given with reference to FIG. 6. Step 40 uses etching or direct photoresist stripping to have a remaining portion of the pixel electrode 501 deposited on FIG. 5 to form a pixel electrode pattern 601. In the preferred embodiment, direct photoresist stripping is conducted on the base plate 200 to form the pixel electrode pattern 601.

Alternatively, in another preferred embodiment, the base plate 200 is subjected to etching (such as etching), such that the etching is performed to such an extent as to just etch off photoresist 402 on the pixel electrode 501 (see FIG. 5), while the pixel electrode pattern 601 (FIG. 6) is only etched off with a minor portion thereof; and the stripping of the photoresist is conducted to form the pixel electrode pattern 601. The operations of dry-etching/wet-etching the pixel electrode 501 on the photoresist 402, the capability of stripping photoresist can be enhanced.

Next, it may selectively comprise conducting deposition of gate/drain metal electrode film layer on the base plate 200. Such a film layer can be a metal film layer structure formed of molybdenum/aluminum/molybdenum (Mo/Al/Mo) or titanium/aluminum/titanium (Ti/Al/Ti). Next, photoresist coating, exposure, development, and etching, and photoresist stripping are preformed.

To this point, a basic structure of the entire thin-film transistor is completed. Such a thin-film transistor manufacturing process can be slightly modified according to actual situations.

The present invention provides a manufacturing method that is applicable to general thin-film transistor. According to the preferred embodiment of the present invention, the present invention allows a PV layer and pixel ITO to be done with one mask operation so as to save one mask. The major feature is that after deposition of the PV layer and after-PV PR exposure and development, PV etching and PR hazing are conducted and then pixel ITO is deposited. Under this condition, ITO of non-pixel electrode pattern is deposited on the hazed PR, due to shading effect of the PR haze surface, ITO cannot completely cover the PR surface so that in stripping PR, a stripping liquid can readily contact PR to achieve high efficiency stripping. On the other hand, since the surface area is greatly increased after PR hazing, the thickness of ITO deposited on PR is much smaller than ITO that defines the pixel electrode so that ITO etching solution could effectively complete etching of ITO on the PR surface, while ITO on the pixel electrode has a minor loss.

In summary, the TFT manufacturing method according to the present invention provides an effective method of stripping ITO deposited on PR, which is applicable to a three-mask based TFT manufacturing process and could greatly improve manufacturing efficiency and reduce difficulty to thereby effectively enhance capability of the three-mask based manufacturing process.

Based on the description given above, those having ordinary skills of the art may easily contemplate various changes and modifications of the technical solution and technical ideas of the present invention and all these changes and modifications are considered within the protection scope of right for the present invention as defined in the appended claims.

What is claimed is:

1. A t thin-film transistor (TFT) substrate manufacturing method, comprising:
   Step 10: applying a first mask-based operation to form a TFT gate electrode pattern on a base plate;
   Step 20: applying a second mask-based operation to form an active layer pattern and a source/drain metal electrode pattern on the base plate;
   Step 30: depositing a passivation layer on the base plate, coating photoresist, applying a third mask-based operation to define a pixel electrode pattern, conducting etching and photoresist haze operations, and then depositing a pixel electrode; and
   Step 40: conducting etching or direct photoresist stripping to form the pixel electrode pattern;
   wherein the photoresist haze operation forms irregularities on a surface of the photoresist so as to increase surface roughness of the surface of the photoresist, which includes multiple tapers having a height of 10 Å-10000 Å, a maximum taper angle greater than 80 degrees, and a taper-to-taper spacing distance of 10 Å-20000 Å, so as to provide a shading effect that prevents a material that makes the pixel electrode that is deposited after the formation of the irregularities on the surface of the photoresist from completely covering the surface of the photoresist.

2. The TFT substrate manufacturing method as claimed in claim 1, wherein the second mask-based operation involves a half tone mask or a gray tone mask.

3. The TFT substrate manufacturing method as claimed in claim 1, wherein the third mask-based operation involves a half tone mask or a regular mask.

4. The TFT substrate manufacturing method as claimed in claim 1, wherein Step 30 comprises: depositing the passivation layer on the base plate, and coating photoresist, conducting exposure and development with the third mask-based operation to define the pixel electrode pattern, conducting etching to expose a gate pattern and a source/drain metal electrode pattern, and conducting etching to form a haze surface on the photoresist, and then depositing the pixel electrode.

5. The TFT substrate manufacturing method as claimed in claim 4, wherein the etching is dry etching.

6. The TFT substrate manufacturing method as claimed in claim 5, wherein an etching gas used in the dry etching is one or a mixture of gases of $SF_6$, $CF_4$, $C_4F_8$, Ar, He, and $O_2$ and an etching pressure is 5 mT-10000 mT.

7. The TFT substrate manufacturing method as claimed in claim 1, wherein the active layer comprises amorphous silicon (A-Si) or indium gallium zinc oxide (IGZO).

8. The TFT substrate manufacturing method as claimed in claim 1, wherein the passivation layer comprises $SiN_x$ or SiO.

9. The TFT substrate manufacturing method as claimed in claim 1, wherein the pixel electrode comprises indium tin oxide (ITO).

10. A thin-film transistor (TFT) substrate manufacturing method, comprising:
    Step 10: applying a first mask-based operation to form a TFT gate electrode pattern on a base plate;
    Step 20: applying a second mask-based operation to form an active layer pattern and a source/drain metal electrode pattern on the base plate;
    Step 30: depositing a passivation layer on the base plate, coating photoresist, applying a third mask-based operation to define a pixel electrode pattern, conducting etching and photoresist haze operations, and then depositing a pixel electrode; and
    Step 40: conducting etching or direct photoresist stripping to form the pixel electrode pattern;
    wherein the photoresist haze operation forms irregularities on a surface of the photoresist so as to increase surface roughness of the surface of the photoresist, which includes multiple tapers having a height of 10 Å-10000 Å, a maximum taper angle greater than 80 degrees, and a taper-to-taper spacing distance of 10 Å-20000 Å, so as to provide a shading effect that prevents a material that makes the pixel electrode that is deposited after the formation of the irregularities on the surface of the photoresist from completely covering the surface of the photoresist;

wherein the active layer comprises amorphous silicon (A-Si) or indium gallium zinc oxide (IGZO);

wherein the passivation layer comprises $SiN_x$ or SiO; and wherein the pixel electrode comprises indium tin oxide (ITO).

11. The TFT substrate manufacturing method as claimed in claim 10, wherein the second mask-based operation involves a half tone mask or a gray tone mask.

12. The TFT substrate manufacturing method as claimed in claim 10, wherein the third mask-based operation involves a half tone mask or a regular mask.

13. The TFT substrate manufacturing method as claimed in claim 10, wherein Step 30 comprises: depositing the passivation layer on the base plate, and coating photoresist, conducting exposure and development with the third mask-based operation to define the pixel electrode pattern, conducting etching to expose a gate pattern and a source/drain metal electrode pattern, and conducting etching to form a haze surface on the photoresist, and then depositing the pixel electrode.

14. The TFT substrate manufacturing method as claimed in claim 13, wherein the etching is dry etching.

15. The TFT substrate manufacturing method as claimed in claim 14, wherein an etching gas used in the dry etching is one or a mixture of gases of $SF_6$, $CF_4$, $C_4F_8$, Ar, He, and $O_2$ and an etching pressure is 5 mT-10000 mT.

* * * * *